United States Patent
Miyata et al.

(10) Patent No.: US 8,212,141 B2
(45) Date of Patent: Jul. 3, 2012

(54) ORGANIC SEMICONDUCTOR RADIATION/LIGHT SENSOR AND RADIATION/LIGHT DETECTOR

(75) Inventors: Hitoshi Miyata, Niigata (JP); Yoshimasa Fujigaki, Niigata (JP); Yoji Yamaguchi, Gunma (JP); Yoshinori Muto, Gunma (JP); Masaaki Tamura, Gunma (JP)

(73) Assignees: Niigata University, Niigata (JP); Japan Carlit Co., Ltd., Tokyo (JP)

( * ) Notice: Subject to any disclaimer, the term of this patent is extended or adjusted under 35 U.S.C. 154(b) by 975 days.

(21) Appl. No.: 12/278,552

(22) PCT Filed: Oct. 20, 2006

(86) PCT No.: PCT/JP2006/320925
§ 371 (c)(1),
(2), (4) Date: Aug. 6, 2008

(87) PCT Pub. No.: WO2007/091352
PCT Pub. Date: Aug. 16, 2007

(65) Prior Publication Data
US 2009/0050815 A1    Feb. 26, 2009

(30) Foreign Application Priority Data
Feb. 7, 2006    (JP) .................................. 2006-030324

(51) Int. Cl.
*H01L 31/042*    (2006.01)

(52) U.S. Cl. ........ 136/251; 136/206; 136/226; 136/228; 136/253; 136/263; 257/660; 257/659; 257/E51.015; 257/E51.008; 257/E51.026; 257/E31.092; 257/E31.093; 438/91; 438/99; 250/385.1; 250/338.4; 250/333; 250/370.11; 250/390.11; 250/200; 250/390.05; 250/390.01

(58) Field of Classification Search .................. 257/660, 257/659, E51.015, E51.008, E51.026, E31.092, 257/E31.093, 10, 11; 438/91, 99; 250/385.1, 250/338.4, 333, 370.11, 200, 390.01, 390.05, 250/390.11; 136/206, 226, 228, 251, 253, 136/263
See application file for complete search history.

(56) References Cited

U.S. PATENT DOCUMENTS
4,237,470 A    12/1980    Raudorf
(Continued)

FOREIGN PATENT DOCUMENTS
JP    54128300    10/1979
(Continued)

OTHER PUBLICATIONS
Kleinknechit, "Detectors for Particle Radiation".

*Primary Examiner* — Meiya Li
(74) *Attorney, Agent, or Firm* — McDermott Will & Emery LLP; Louis J. DelJuidice, Esq.

(57) ABSTRACT

There is provided a high-sensitivity organic semiconductor radiation/light sensor and a radiation/light detector which can detect rays in real time. In the high-sensitivity organic semiconductor radiation/light sensor, a signal amplification wire 2 is embedded in an organic semiconductor 1. Carriers created by passage of radiation or light are avalanche-amplified by a high electric field generated near the signal amplification wire 2 by means of applying a high voltage to the signal amplification wire 2, thus dramatically improving detection efficiency of rays. Hence, even rays exhibiting low energy loss capability can be detected in real time with high sensitivity.

6 Claims, 6 Drawing Sheets

U.S. PATENT DOCUMENTS

| | | | |
|---|---|---|---|
| 4,913,744 A | 4/1990 | Hoegl et al. | |
| 5,500,534 A | 3/1996 | Robinson et al. | |
| 6,433,335 B1 | 8/2002 | Kronenberg et al. | |
| 7,186,987 B1 * | 3/2007 | Doty et al. | 250/390.01 |

FOREIGN PATENT DOCUMENTS

| | | |
|---|---|---|
| JP | 63-012179 | 1/1988 |
| JP | 63-232467 | 9/1988 |
| JP | 01502050 | 7/1989 |
| JP | 05-003337 | 1/1993 |
| JP | 08509550 | 10/1996 |
| JP | 10-284748 | 10/1998 |
| WO | WO-8802495 | 4/1988 |
| WO | WO-94/25878 | 11/1994 |

* cited by examiner

ORGANIC SEMICONDUCTOR RADIATION/LIGHT SENSOR AND RADIATION/LIGHT DETECTOR

CROSS REFERENCE TO PROIR APPLICATIONS

This application is the U.S. national phase application of International Application No. PCT/JP2006/320925, filed Oct. 20, 2006, which claims priority from Japanese Patent Application No. 2006-030324, filed Feb. 7, 2006. Both applications are incorporated herein by reference in their entirety. The International Application was published in Japanese on Aug. 16, 2007 as WO 2007/091352 under PCT Article 21(2).

TECHNICAL FIELD

The present invention relates to an organic semiconductor radiation/light sensor and a radiation/light detector using the same.

BACKGROUND ART

In general, when radiation comprising charged particles such as rays or rays passes through matter, the radiation loses energy by ionizing, exciting and dissociating atoms and molecules which exist in the matter. At the same time, the energy thus lost is converted into thermal motion energy, or transformed into electromagnetic energy to be discharged, or used as energy for creating charge carriers. Particularly, when the radiation is the one incident on a semiconductor, a significant part of energy lost from the incident particles is employed as energy for creating a pair (a carrier) of an electron and a hole. With respect to non-charged radiation such as X-rays, γ rays, neutron rays or the like, the same phenomena described above also occurs by an impact of secondary electrons generated in the interaction between the matter and these rays. Then, these carriers such as electrons and holes which have been generated are collected and captured as an electric signal by an electric field and thereby radiation detection is generally performed by a semiconductor.

As semiconductors which generate the carriers along with passage of radiation, there exist inorganic semiconductors represented by silicon, germanium crystal or the like and organic semiconductors represented by polyaniline, polythiophene or the like.

By being produced as ultrapure crystal, the inorganic semiconductor is provided with a reduced dark current and an excellent S/N ratio. Therefore, the inorganic semiconductor is being extensively employed as a real-time sensor in a radiation detector.

On the contrary, the organic semiconductor is low in cost as compared to the inorganic semiconductor and is possessed of excellent properties such as flexibility to be easily bent or the like. The organic semiconductor, however, is presently poor in sensitivity as compared to the inorganic semiconductor due to an impact of its impurities, nonuniformity of polymer molecular mass, etc. thus not yet having come to practical use as a sensor of real-time radiation detection in the existing circumstances.

Patent document 1: Japanese unexamined patent application publication No.: H10-284748
Patent document 2: Japanese unexamined patent application publication No.: H5-3337
Non-patent document 1: "Detectors for Particle Radiation Basis and Application of Radiation Measurement" written by K. Kleinknecht, translated by Kasuke Takahashi and Hajime Yoshiki, published by Baifukan, 1987

DISCLOSURE OF THE INVENTION

Problem to be Solved by the Invention

As described above, an organic semiconductor has had the problem that its sensitivity, i.e., its detection efficiency as a sensor for a real-time signal of radiation was low. So, when the organic semiconductor has been employed, no success has ever been attained in detecting the radiation such as rays or the like that were less in energy loss as compared to rays.

The organic semiconductor, however, is low in cost and is possessed of flexibility, and therefore if the organic semiconductor can be utilized as a real-time radiation sensor capable of detecting rays, it is expected that the organic semiconductor can contribute to development of a new application of a semiconductor radiation detector, which has been unimaginable in the case of utilizing the conventional inorganic semiconductor, in such a manner as to permit a large-sized and curved semiconductor radiation detector to be comparatively easily made up and so on.

Therefore, it is an object of the present invention to provide an organic semiconductor radiation sensor and a radiation detector which can detect rays in real time and are high sensitive.

Mean for Solving the Problem

As a result of various inspections in order to solve the problem described above, it has been discovered that a fine conductive wire was embedded in an organic semiconductor and then carriers created by passage of radiation were avalanche-amplified by a high electric field created near the wire by means of applying a high voltage, thereby enabling rays to be detected. Thus, the present invention has been accomplished.

Therefore, an organic semiconductor radiation/light sensor according to the present invention is characterized in that a signal amplification wire is embedded in an organic semiconductor.

Further, the organic semiconductor radiation/light sensor according to the present invention is characterized in that the signal amplification wire is a metal wire.

Furthermore, the organic semiconductor radiation/light sensor according to the present invention is characterized in that the signal amplification wire is 10 to 100 m in diameter.

Moreover, the organic semiconductor radiation/light sensor according to the present invention is characterized in that the organic semiconductor is any one of polyaniline, polythiophene, and polypyrrole.

Besides, the organic semiconductor radiation/light sensor according to the present invention is characterized in that the organic semiconductor is substantially columnar and then the signal amplification wire is arranged substantially parallel with a bottom of the organic semiconductor and further an electrode formed by deposition is provided on an upper surface of the organic semiconductor.

Further, the organic semiconductor radiation/light sensor according to the present invention is characterized in that the organic semiconductor is substantially columnar and the signal amplification wire is arranged on a central axis of the organic semiconductor and further an electrode formed by deposition is provided across an entire circumference of a lateral face of the organic semiconductor.

Furthermore, the organic semiconductor radiation/light sensor according to the present invention is characterized in that the organic semiconductor is flat-plate-shaped and the signal amplification wire is arranged substantially parallel with an upper surface of the organic semiconductor in a grid pattern and further an electrode formed by deposition is provided across an entire upper surface of the organic semiconductor.

An organic semiconductor radiation/light detector according to the present invention is characterized in that the detector is equipped with the organic semiconductor radiation/light sensor embedded with the signal amplification wire in an organic semiconductor.

Further, the organic semiconductor radiation/light detector according to the present invention is characterized in that the signal amplification wire is a metal wire, Furthermore, the organic semiconductor radiation/light detector according to the present invention is characterized in that the signal amplification wire is 10 to 100 m in diameter.

Moreover, the organic semiconductor radiation/light detector according to the present invention is characterized in that the organic semiconductor is any one of polyaniline, polythiophene and polypyrrole.

Besides, the organic semiconductor radiation/light detector according to the present invention is characterized in that the organic semiconductor is substantially columnar and then the signal amplification wire is arranged substantially parallel with a bottom of the organic semiconductor and further an electrode formed by deposition is provided on the upper surface of the organic semiconductor.

Further, the organic semiconductor radiation/light detector according to the present invention is characterized in that the organic semiconductor is substantially columnar and the signal amplification wire is arranged on the central axis of the organic semiconductor and further the electrode formed by deposition is provided across the entire circumference of the lateral face of the organic semiconductor.

Furthermore, the organic semiconductor radiation/light sensor according to the present invention is characterized in that the organic semiconductor is flat-plate-shaped and the signal amplification wires are arranged substantially parallel with the upper surface of the organic semiconductor in a grid pattern and further the electrode formed by deposition is provided across the entire upper surface of the organic semiconductor.

Moreover, the organic semiconductor radiation/light sensor is characterized in that the sensor is equipped with a plurality of the signal amplification wires to specify a position of radiation or light based on positions of the signal amplification wires which have detected the radiation or the light.

Effects of the Invention

According to the organic semiconductor radiation/light sensor of the present invention, the carriers created by passage of radiation or light are avalanche-amplified by the high electric field generated near the signal amplification wire by means of applying the high voltage to the signal amplification wire, thus improving dramatically detection efficiency. Hence, even radiation such as rays exhibiting low energy loss capability or the like can be detected in real time with high sensitivity. Besides, the organic semiconductor is low in cost and is easy to deal with and further is flexible and therefore a radiation sensor applicable to new applications can be provided.

Further, the metal wire is used as the signal amplification wire. Hence, the organic semiconductor radiation/light sensor can be provided at low cost.

Furthermore, the signal amplification wire is 10 to 100 m in diameter. Hence, the carriers created by the passage of radiation or light can be certainly avalanche-amplified and besides the organic semiconductor radiation/light sensor can be made easy to deal with in its fabrication and in its use.

Moreover, the organic semiconductor is any one of polyaniline, polythiophene and polypyrrole. Hence, the organic semiconductor sensor can be provided at low cost.

Besides, the organic semiconductor is substantially columnar and then the signal amplification wire is arranged substantially parallel with a bottom of the organic semiconductor and further the electrode formed by deposition is provided on the upper surface of the organic semiconductor. Hence, the organic semiconductor radiation/light sensor can be provided which can be easily fabricated.

Further, the organic semiconductor is substantially columnar and the signal amplification wire is arranged on a central axis of the organic semiconductor and further the electrode formed by deposition is provided across an entire circumference of a lateral face of the organic semiconductor. Hence, an electric field within the sensor can be made uniform, permitting the organic semiconductor sensor with high sensitivity to be provided.

Furthermore, the organic semiconductor is flat-plate-shaped and the signal amplification wires are arranged substantially parallel with an upper surface of the organic semiconductor in a grid pattern and further the electrode formed by deposition is provided across an entire upper surface of the organic semiconductor. Hence, by observing a signal coming from each of the signal amplification wires, information on positions of the signal amplification wires which have detected radiation or light can be obtained and then based on the information, a position through which the radiation or the light has passed can be specified as a point on a plane.

According to the radiation/light detector of the present invention, included is the organic semiconductor radiation/light sensor embedded with the signal amplification wire in the organic semiconductor. Hence, a radiation/light detector can be provided which can detect even β rays exhibiting low energy loss capability in real time with high sensitivity.

Further, by utilizing a metal wire as the signal amplification wire, the organic semiconductor radiation/light detector can be provided at low cost.

Furthermore, the signal amplification wire is 10 to 100 m in diameter. Hence, the carriers created by passage of radiation or light can be certainly avalanche-amplified and besides the radiation/light detector can be made easy to deal with in its fabrication and in its use.

Moreover, the organic semiconductor is any one of polyaniline, polythiophene and polypyrrole. Hence, the radiation/light detector can be provided at low cost.

Further, the organic semiconductor is substantially columnar and then the signal amplification wire is arranged substantially parallel with the bottom of the organic semiconductor and further the electrode formed by deposition is provided on the upper surface of the organic semiconductor. Hence, the radiation/light detector can be provided which can be easily fabricated.

Furthermore, the organic semiconductor is substantially columnar and the signal amplification wire is arranged on the central axis of the organic semiconductor and further the electrode formed by deposition is provided across an entire circumference of a lateral face of the organic semiconductor.

Hence, the electric field within the sensor can be made uniform, permitting the radiation/light detector with high sensitivity to be provided.

Moreover, the organic semiconductor is flat-plate-shaped and the signal amplification wires are arranged substantially parallel with the upper surface of the organic semiconductor in a grid pattern and further the electrode formed by deposition is provided across the entire upper surface of the organic semiconductor. Hence, by observing a signal coming from each of the signal amplification wires, information on positions of the signal amplification wires which have detected radiation or light can be obtained and then based on the information, a position through which the radiation or the light has passed can be specified as a point on a plane.

Further, the organic semiconductor radiation/light sensor is equipped with a plurality of the signal amplification wires to specify a position of radiation or light based on positions of the signal amplification wires which have detected the radiation or the light. Hence, regardless of its simple structure, the sensor can detect a position of the radiation or light which has passed through the signal amplification wires.

DESCRIPTION OF NUMERAL SYMBOLS 1, 11, 21: organic semiconductor
2, 12, 22a, 22b: signal amplification wire
3, 13, 23: electrode

BEST MODE FOR CARRYING OUT THE INVENTION

Hereunder is a description of an embodiment of an organic semiconductor radiation/light sensor and a radiation/light detector according to the present invention with reference to the accompanying drawings.
(Embodiment 1)

Figure 1:
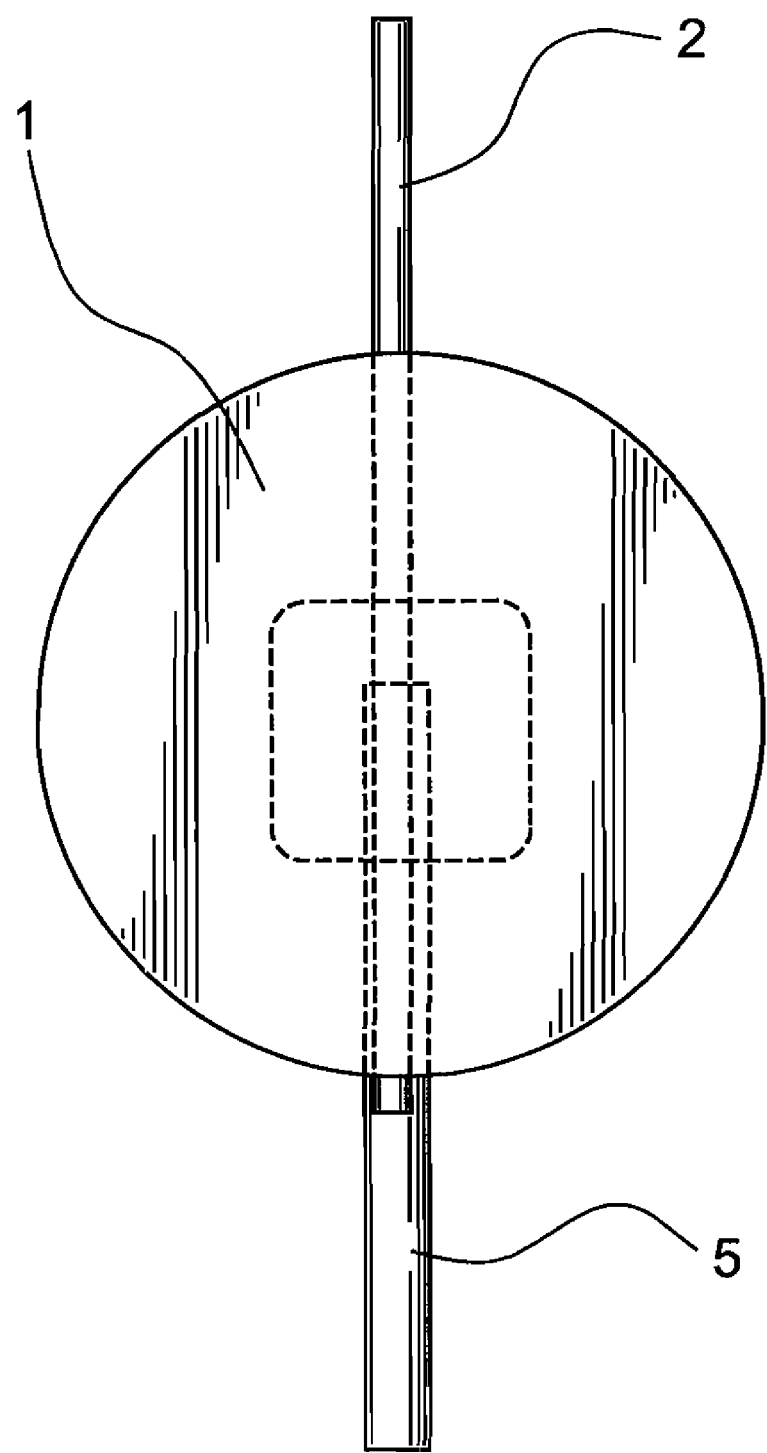
FIG. 1 is a top view illustrating an organic semiconductor radiation/light sensor according to a first embodiment of the present invention.
Figure 2:
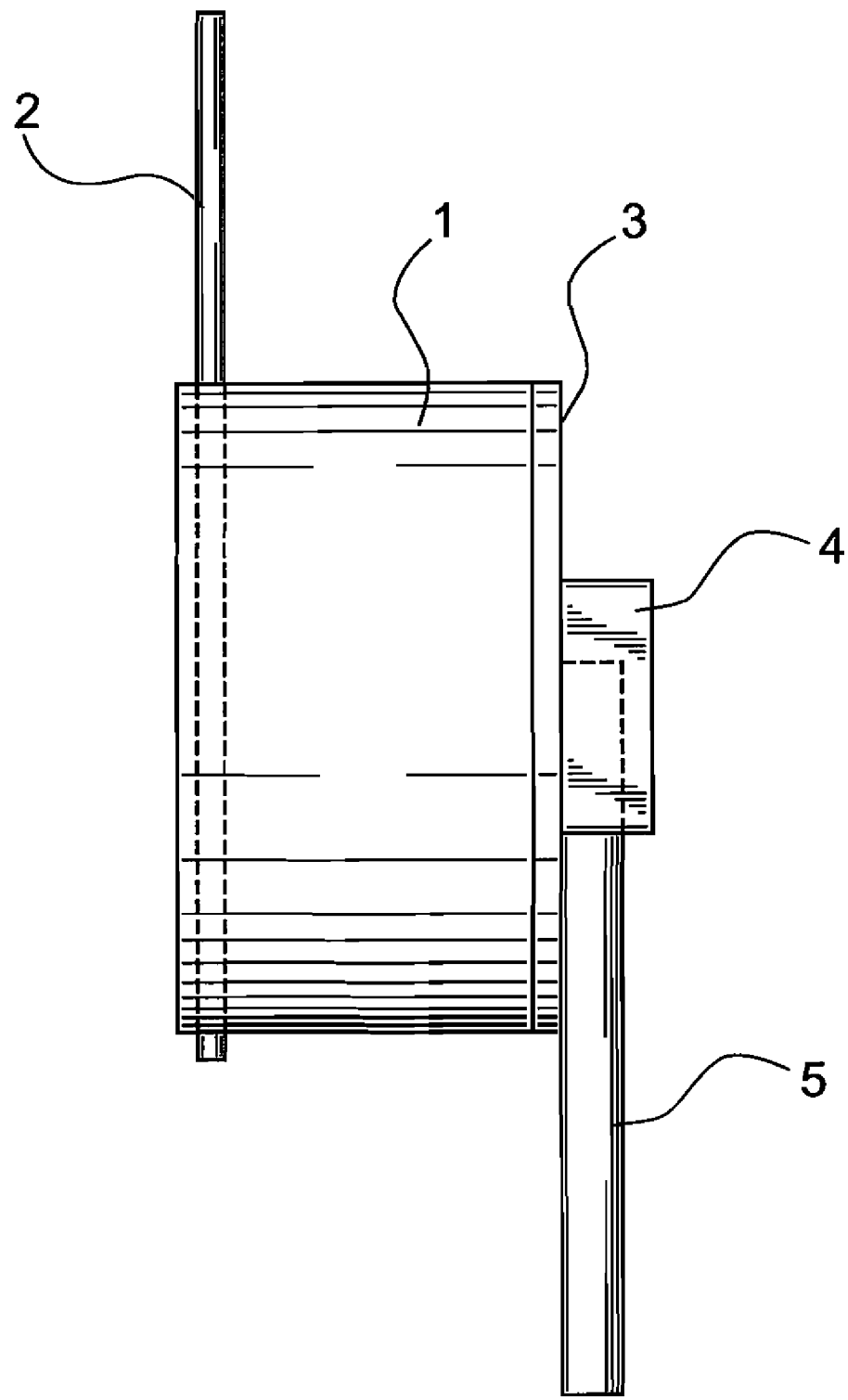
FIG. 2 is a side view illustrating the same.
Figure 3:
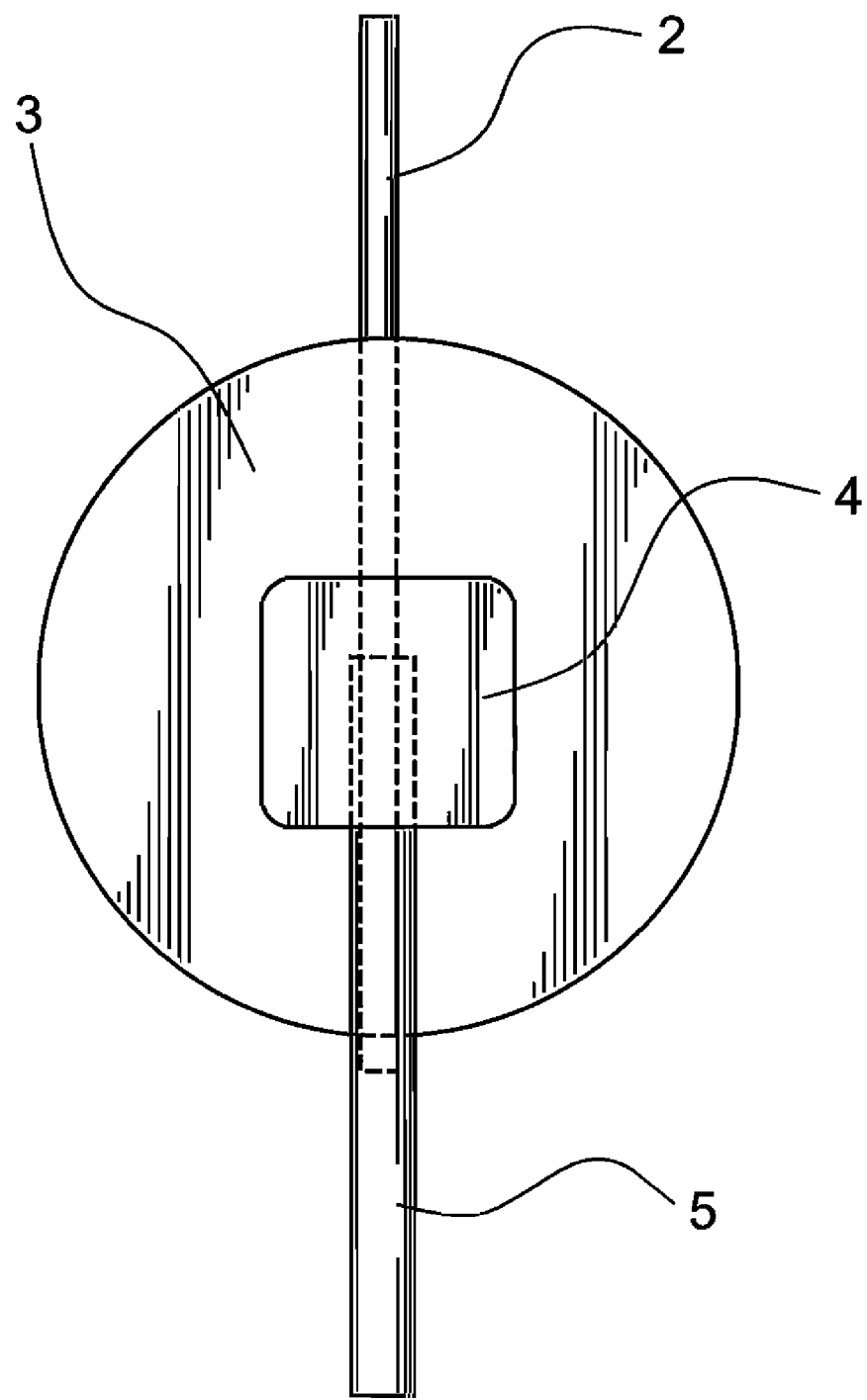
FIG. 3 is a bottom plane view illustrating the same.

In FIG. 1 to FIG. 3, a first embodiment of the organic semiconductor radiation/light sensor and the radiation/light detector according to the present invention are shown.

Numeral symbol 1 denotes an organic semiconductor formed in a substantially columnar shape with 7 mm in diameter and 3 mm in thickness. In addition, the thicker the organic semiconductor 1, the larger, the number of carriers created by passage of radiation or light and thereby sensitivity of the organic semiconductor radiation/light sensor becomes higher.

Part of a signal amplification wire 2 is embedded in the organic semiconductor 1. This signal amplification wire 2 is arranged substantially parallel with one surface of the organic semiconductor 1 which is substantially columnar. In addition, in the present embodiment, for reasons of fabrication, the signal amplification wire 2 is embedded in a biased position near one surface of the organic semiconductor 1. To improve uniformity of an electric field inside the sensor and sensitivity of the sensor, however, the signal amplification wire 2 is desirably inserted into a central portion of the organic semiconductor 1.

Here, as a material of the organic semiconductor 1, the material is not limited to a specific one and therefore a conductive polymer molecule such as polyaniline, polythiophene, polypyrrole may be used. Desirably, however, polyaniline may be used due to its high solubility in a solvent, easy availability and inexpensiveness. In addition, the solubility of polyaniline into NMP (N-methyl-2-pyrrolidone) is about 10% by mass. When conductive polymer molecules of a thiophene derivative such as polyalkylthiophene, polyethylenedioxithiophene are used, a low-polarity solvent such as toluene, xylene, chloroform, dichlomethane is used in which these conductive polymer molecules are high dissoluble. Besides, these conductive polymer molecules can be also used in their slurry states where they are not fully dissolved in a solvent. Material of the organic semiconductor 1 is not specifically limited in its purity.

As a material used for the signal amplification wire 2, any materials may be utilized if they are conductive and therefore the material is not confined to a specific one. A metal wire, however, is suitably utilized because it is easy to process in a uniform diameter and in consideration of its strength and its cost. In addition, in the present embodiment, utilized are polyaniline and a gold-plated tungsten wire with a circular cross section and a diameter of 30 m as the organic semiconductor 1 and the signal amplification wire 2, respectively.

Further, a size of the signal amplification wire 2 is not specifically confined insofar as the size is sufficient to allow the carriers, which has been generated by the passage of radiation and light, to be avalanche-amplified and hence the size can be varied depending on a voltage applied to the signal amplification wire 2. The thinner the signal amplification wire 2, the electric field near the signal amplification wire 2 gets higher in intensity to permit the avalanche amplification to be performed at a lower voltage. Hence, it is desirable that the wire is thinner for attaining the avalanche amplification with certainty. On the contrary, a certain magnitude of the size is required for making the wire easy to deal with in fabricating and using the organic semiconductor radiation/light sensor and for maintaining its durability. Accordingly, it is desirable that the size of the signal amplification wire 2 is 10 to 100 m. In addition, the diameter referred to here means an average diameter of the signal amplification wire 2 and when the cross section is not perfectly circular, a maximum diameter is taken.

Further, an electrode 3 formed by deposition is provided on the other plane of the organic semiconductor 1 near which the signal amplification wire 2 of the organic semiconductor 1 is not located. Gold is used as a material of the electrode 3, while the other metals are also usable. A lead wire 5 is fitted on the electrode 3 by using a conductive tape 4 made up of copper. In addition, here, a gold-plated tungsten wire with a diameter of 150 m is used as the lead wire 5.

Next is a description of a method for fabricating the organic semiconductor radiation/light sensor.

First, NMP (N-methyl-2-pyrodorine) solution of polyaniline is dried within a circular container with a diameter of 10 mm to fabricate a solid-state organic semiconductor 1. At this time, before polyaniline is completely dried, the gold-plated tungsten wire, acting as the signal amplification wire 2, with a diameter of 30 m is placed on the polyaniline and then a polyaniline solution is added to be dried.

By this operation, the signal amplification wire 2 is embedded in the organic semiconductor 1. In addition, when dried, the polyaniline solution is put in a press container to be heated under pressure applied and thereby it becomes easy to form thickly the organic semiconductor 1 as well as being capable of drying the same at short times.

Next, after the polyaniline has been completely dried, an opposite plane of the organic semiconductor 1 to a plane where the signal amplification wire 2 is embedded is subjected to a gold-plating process to form the electrode 3. Then, the gold-plated tungsten wire with a diameter of 150 m, acting as the lead wire 5, is attached to an upper plane of the electrode 3 by using the conductive tape 4 made up of copper.

When the organic semiconductor radiation/light sensor according to the present embodiment is used, a voltage of 1 to 3 KV is applied across the signal amplification wire 2 and the lead wire 5. The application of the high voltage like this collects, near the signal amplification wire 2, the carrier generated by the passage of radiation and light through the organic semiconductor 1 and thereby the avalanche amplification is practiced near the signal amplification wire 2. In addition, if the applied voltage were too high, the organic semiconductor 1 would be led to be damaged, while if the applied voltage were too low, the gain due to the avalanche amplification would be low to degrade a signal-to-noise ratio (an S/N ratio). Hence, an appropriate voltage is desirably set in advance.

The avalanche amplification increases the number of carriers, i.e., a quantity of output electric charge by a factor of several hundreds or more. Thus, by applying a voltage to the signal amplification wire 2, the sufficient gain can be obtained by the avalanche amplification even only by means of the radiation/light sensor. Hence, the high-gain amplifier which has been mounted on the conventional inorganic semiconductor radiation sensor can be replaced by a low-gain amplifier or further can be omitted. Consequently, the usage of the organic semiconductor radiation/light sensor according to the present embodiment permits a radiation/light detector to be realized at low cost.

In addition, for example, the conventional radiation detector equipped with the inorganic semiconductor radiation sensor comprising a silicon PIN photodiode took advantage of no avalanche amplification and hence an amplifier with not less than thousands times as much high gain was required.

Figure 4:
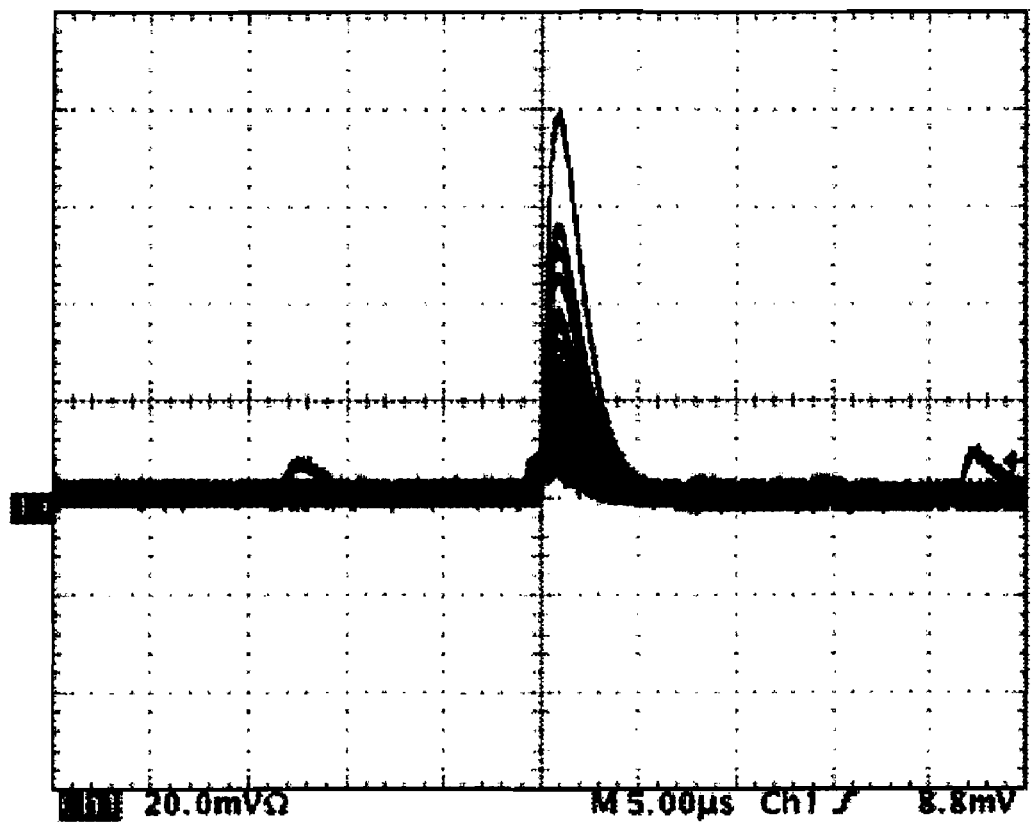
FIG. 4 is a graph illustrating output signals, observed by an oscilloscope, against rays' incidence measured using the organic semiconductor radiation/light sensor according to the first embodiment of the present invention.
Figure 5:
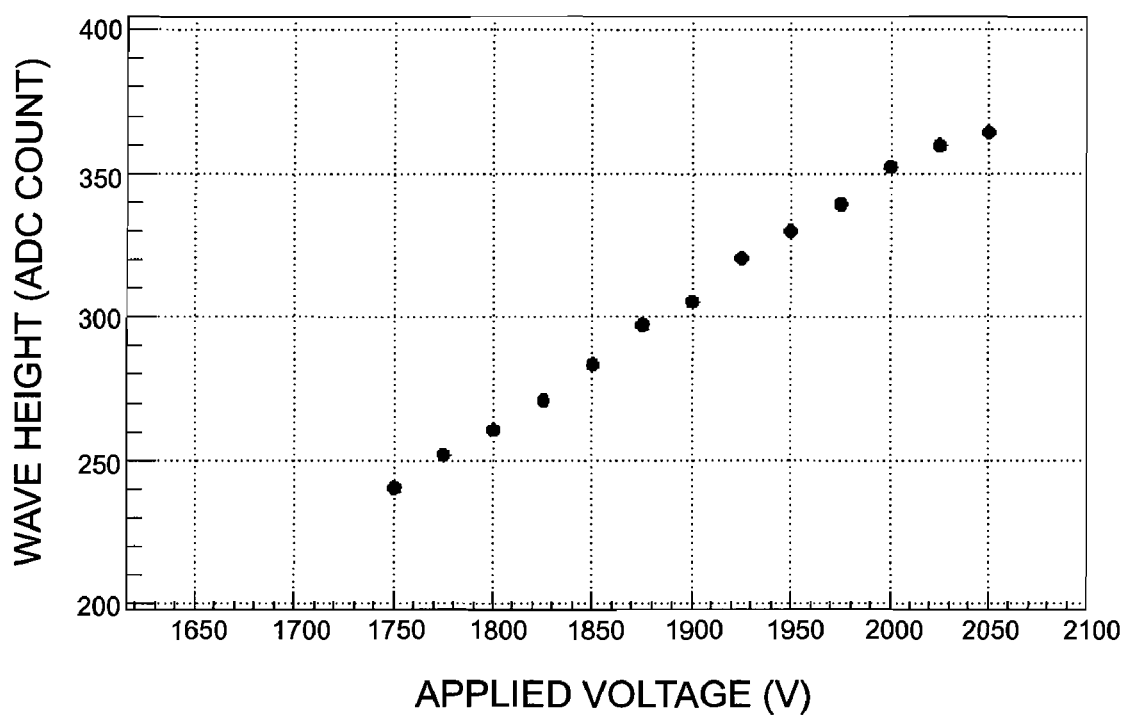
FIG. 5 is a graph illustrating a dependency of wave heights of the output signals described above on applied voltages.

Actually, the conventional amplifier using the silicon PIN photodiode was mounted on the organic semiconductor radiation/light sensor according to the present embodiment to build up a radiation/light detector. The signal of rays obtained by successful observation using the radiation/light detector thus built up and the applied voltage dependence of wave heights of output signals are shown in FIG. 4 and in FIG. 5, respectively. Here, an area of the waveform shown in FIG. 4 and the wave height shown in FIG. 5 are proportional to an amount of the electric charge observed. In this manner, it has been verified that the organic semiconductor radiation/light sensor according to the present embodiment was extremely supersensitive since a faint signal was amplified and observed by applying a high voltage.

In addition, the organic semiconductor radiation/light sensor according to the present embodiment can detect rays, γ rays, X-rays and neutron rays in addition to rays and further ultraviolet, visible and infrared rays and thus can be applied as an optical detector such as an optical monitor.

As described above, the organic semiconductor radiation/light sensor according to the present embodiment is embedded with the signal amplification wire 2 in the organic semiconductor 1 and then, the carriers created by the passage of radiation or light are avalanche-amplified by the high electric field created near the signal amplification wire 2 by means of applying a high voltage to the signal amplification wire 2 and then, thus dramatically improving the detection efficiency. Hence, even radiation such as rays exhibiting smaller energy loss capability can be detected in real time with high sensitivity.

Further, a metal wire is used as the signal amplification wire 2 and hence an organic semiconductor radiation/light sensor can be provided at low cost.

Furthermore, the signal amplification wire 2 is 10 to 100 m in diameter. Hence, the carriers created by the passage of radiation or light can be certainly avalanche-amplified and besides the organic semiconductor radiation/light sensor can be made easy to handle in its fabrication and in its use.

Moreover, the organic semiconductor 1 is polyaniline. Hence, the organic semiconductor radiation/light sensor can be provided at low cost.

Besides, the organic semiconductor 1 is substantially columnar and the signal amplification wire 2 is arranged substantially parallel with the bottom face of the organic semiconductor 1 and further the electrode formed by deposition is provided on the upper side of the organic semiconductor 1. Hence, the organic semiconductor radiation/light sensor can be provided which can be easily fabricated.

Further, the organic semiconductor radiation/light detector according to the present embodiment is equipped with the organic semiconductor radiation/light sensor. Hence, the radiation/light detector can be provided which can detect even radiation such as rays exhibiting smaller energy loss capability in real time with high sensitivity.

(Embodiment 2)

Figure 6:
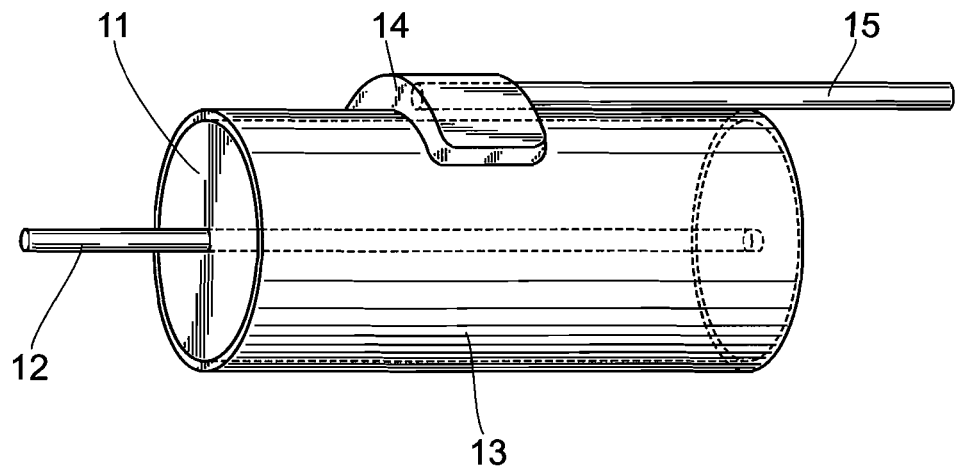
FIG. 6 is a perspective view of an organic semiconductor radiation/light sensor according to a second embodiment of the present invention.

In FIG. 6, shown is a second embodiment of an organic semiconductor radiation/light sensor according to the present invention.

Numeral symbol 11 denotes an organic semiconductor which is formed in a long and substantially columnar shape and is 10 mm in diameter and 50 mm in thickness. Part of a signal amplification wire 12 is embedded in the organic semiconductor 11. Then, the signal amplification wire 12 is arranged on a central axis of the organic semiconductor 11 which is substantially columnar. In the present embodiment, as in the first embodiment, polyaniline and a gold-plated tungsten wire with a circular cross section and 30 m in diameter are used for the organic semiconductor 11 and the signal amplification wire 12, respectively.

Besides, there is provided an electrode 13 which is formed by applying gold evaporation over an entire circumference in a lateral face of the organic semiconductor 11 formed in the substantially columnar shape. A lead wire 15 is attached on the electrode 13 by using a conductive tape made of copper.

When using the organic semiconductor radiation/light sensor according to the present embodiment, a voltage of 1 to 3 KV is applied across the signal amplification wire 12 and the lead wire 15. By applying the high voltage like this, carriers created when radiation and light pass through the organic semiconductor 11 are collected near the signal amplification wire 12 and thereby avalanche amplification is practiced near the signal amplification wire 12.

In the organic semiconductor radiation/light sensor according to the present embodiment, the signal amplification wire 12 is arranged in the central axis of the organic semiconductor 11 formed in the substantially columnar shape and the electrode 13 is arranged in the lateral side of the organic semiconductor 11. Hence, an electric field inside the sensor can be uniformalized and thereby the sensitivity of the sensor becomes excellent.

As described above, the organic semiconductor radiation/light sensor according to the present embodiment is embedded with the signal amplification wire 12 in the organic semiconductor 11 and then, the carriers created by the passage of radiation or light are avalanche-amplified by the high electric field created near the signal amplification wire 12 by means of applying the high voltage to the signal amplification wire 12, thus dramatically improving the detection efficiency. Hence, even radiation such as rays exhibiting smaller energy loss capability can be detected in real time with high sensitivity.

Further, the organic semiconductor 11 is substantially columnar and the signal amplification wire 12 is arranged on the central axis of the organic semiconductor 11 and further the electrode formed by deposition is provided across the entire circumference of the lateral face of the organic semiconductor. Hence, the electric field within the sensor can be made uniform, permitting the organic semiconductor radiation/light sensor with high sensitivity to be provided.

(Embodiment 3)

Except that polyddecylthiophene (a test agent produced by Aldrich) has been used instead of polyaniline for the organic semiconductor 11 in the second embodiment, in a third embodiment, the organic semiconductor radiation/light sensor has been made in the same way as was done in the second embodiment. Also in this organic semiconductor radiation/light sensor, carriers created by passage of radiation or light are avalanche-amplified by a high electric field created near the signal amplification wire 12 by means of applying a high voltage to the signal amplification wire 12. Hence, as in the second embodiment, even radiation such as rays exhibiting smaller energy loss capability can be detected in real time with high sensitivity.

(Embodiment 4)

Figure 7:
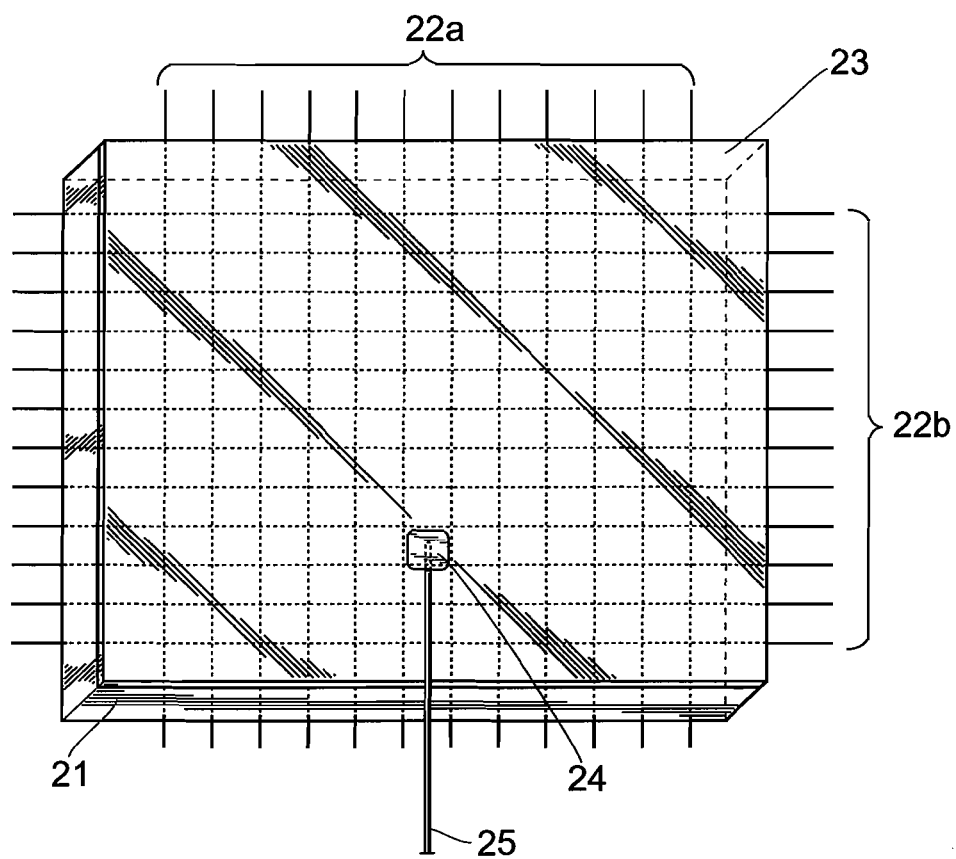
FIG. 7 is a perspective view of an organic semiconductor radiation/light sensor according to a fourth embodiment of the present invention.

In FIG. 7, shown is a fourth embodiment of an organic semiconductor radiation/light sensor according to the present invention.

Numeral symbol 21 denotes an organic semiconductor radiation/light sensor which is made from polyaniline and is formed in a flat plate 15 mm square and 3 mm thick. A plurality of signal amplification wires 22a, 22b are embedded in the organic semiconductor 21. The signal amplification wires 22a, 22b are both arranged substantially parallel with an upper surface of the organic semiconductor 21 and further both the wires 22a, 22b are arranged substantially perpendicularly to each other without being contacted by each other. The plurality of the signal amplification wires 22a are arranged at constant intervals of 1 mm and also the same applies to the signal amplification wires 22b. Thus, the signal amplification wires 22a, 22b are arranged in a grid pattern.

Further, an electrode 23 formed by applying the gold evaporation over an entire area of an upper surface is provided on the top surface of the organic semiconductor 21 formed in a flat-plate shape. On the electrode 23, a lead wire 25 is attached with a conductive tape 24 made of copper.

When using the organic semiconductor radiation/light sensor according to the present embodiment, a voltage of 1 to 3 KV is applied across the signal amplification wires 22a, 22b and the lead wire 25. By applying the high voltage like this, the carrier generated by the passage of radiation or light through the organic semiconductor 21 are collected near the signal amplification wires 22a, 22b and then the avalanche amplification is performed near the signal amplification wires 22a, 22b.

Here, in the present embodiment, the signal amplification wires 22a, 22b are arranged in a grid pattern. Hence, by observing signals coming from each of the signal amplification wires 22a, 22b, information on positions of the signal amplification wires 22a, 22b, where the radiation or the light has been detected can be obtained, thus permitting the position where the radiation or the light has passed through to be specified as a point on a plane based on the information.

Then, using the organic semiconductor radiation/light sensor according to the present embodiment, the position of the radiation or the light is specified based on the positions of the signal amplification wires 22a, 22b where the radiation or the light has been detected and the radiation/light detector is built up so as to be capable of displaying the position specified. As a result, the radiation/light detector can be utilized as, e.g., an X-ray location detection device such as a medical CT scanner or the like. Further, by decreasing the intervals between the signal amplification wires 22a, 22b, a position resolution of radiation or light can be increased. In the case of the present embodiment, the interval between the signal amplification wires 22a, 22b is 1 mm and therefore the position resolution of radiation or light results in 1 mm or less. Consequently, a higher-resolution radiation/light detector can be provided as compared to the conventional CT scanner.

As described above, the organic semiconductor radiation/light sensor according to the present embodiment is embedded with the signal amplification wires 22a, 22b in the organic semiconductor 21 and then, the carriers created by the passage of radiation or light are avalanche-amplified by the high electric field created near the signal amplification wire 22a, 22b by means of applying the high voltage to the signal amplification wire 22a, 22b, thus dramatically improving the detection efficiency. Hence, even radiation such as rays exhibiting smaller energy loss capability can be detected in real time with high sensitivity.

Further, the organic semiconductor 21 is flat-plate-shaped and the signal amplification wires 22a, 22b are arranged substantially parallel with the upper surface of the organic semiconductor in a grid pattern and further the electrode formed by deposition is provided across the entire upper surface of the organic semiconductor 21. Hence, by observing a signal coming from each of the signal amplification wires 22a, 22b, information on positions of the signal amplification wires 22a, 22b which have detected radiation or light can be obtained and then based on the information, a position through which the radiation or the light has passed can be specified as a point on a plane.

Further, the organic semiconductor radiation/light sensor is equipped with a plurality of the signal amplification wires 22a, 22b and thereby specifies the position of the radiation or the light based on the positions of the signal amplification wires 22a, 22b which have detected the radiation or the light. Hence, the position of the radiation or the light which has passed through the signal amplification wires 22a, 22b can be detected even by this simple system.

In addition to this, the organic semiconductor radiation/light sensor uses an organic semiconductor, which is low in cost and is easy to handle and besides is flexible and further can be bent if formed in a sheet-like shape on the order of 100 m in thickness. Hence, a radiation/light sensor can be provided which is applicable to new applications. Utilizing the feature of the organic semiconductor that is inexpensive and is flexible, a large-size and curved radiation/light sensor can be manufactured. If inorganic crystalline semiconductors such as silicon, germanium or the like which have features of high purity in material, high cost and hardness were to be utilized, the sensor like this would not be realized.

In addition, the present invention is not limited to the embodiments describe above and various modifications are possible within departing the gist of the present invention. The form of the organic semiconductor is not limited to one described above and can be accordingly altered into a form suitable for its use.

The organic semiconductor radiation/light detector according to the present invention is considered to be applicable to, e.g., the radiation medicine field such as a position detector of X-rays in a CT scanner, the atomic field, and the space-related field and so on.

The invention claimed is:

1. An organic semiconductor radiation/light detection method, comprising:
   providing an organic semiconductor with a single signal amplification wire that is embedded within the organic semiconductor and pierces through the organic semiconductor in a direction of diameter;
   creating carriers by passage of either radiation or light through the organic semiconductor;
   avalanche-amplifying the carriers by a high electric field created near the single signal amplification wire by applying a high voltage to the single signal amplification wire.

2. The organic semiconductor radiation/light detection method according to claim 1, wherein said single signal amplification wire is a metal wire.

3. The organic semiconductor radiation/light detection method according to claim 1, wherein said single signal amplification wire is 10 to 100 µm in diameter.

4. The organic semiconductor radiation/light detection method according to claim 1, wherein said organic semiconductor is made of any one of polyaniline, polythiophene and polypyrrole.

5. The organic semiconductor radiation/light detection method according to claim 1, further comprising:
   depositing an electrode on an upper surface of the organic semiconductor; wherein said organic semiconductor is substantially columnar, said single signal amplification wire is arranged substantially parallel with a bottom face of the organic semiconductor.

6. The organic semiconductor radiation/light detection method according to claim 1, further comprising:
   depositing an electrode over an entire circumference of a lateral side of the organic semiconductor; wherein the organic semiconductor is substantially columnar, said signal amplification wire is arranged on a central axis of the organic semiconductor.

* * * * *